United States Patent
Han

(10) Patent No.: US 9,577,055 B2
(45) Date of Patent: Feb. 21, 2017

(54) SEMICONDUCTOR DEVICE HAVING A MINIMIZED REGION OF SHEILD ELECTRODE AND GATE ELECTRODE OVERLAP

(71) Applicant: Magnachip Semiconductor, Ltd., Cheongju-si (KR)

(72) Inventor: Jin Woo Han, Cheongju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 14/494,858

(22) Filed: Sep. 24, 2014

(65) Prior Publication Data
US 2015/0115352 A1    Apr. 30, 2015

(30) Foreign Application Priority Data
Oct. 28, 2013  (KR) .................. 10-2013-0128705

(51) Int. Cl.
| H01L 29/423 | (2006.01) |
| H01L 29/40 | (2006.01) |
| H01L 29/78 | (2006.01) |
| H01L 29/06 | (2006.01) |

(52) U.S. Cl.
CPC ......... *H01L 29/407* (2013.01); *H01L 29/0649* (2013.01); *H01L 29/7811* (2013.01); *H01L 29/7813* (2013.01)

(58) Field of Classification Search
CPC . H01L 29/4236; H01L 29/7825; H01L 29/407

USPC .......................... 257/330, 331, 340, 341, 386
See application file for complete search history.

(56) References Cited

U.S. PATENT DOCUMENTS

| 5,625,217 A | * | 4/1997 | Chau et al. .................... 257/412 |
| 6,891,223 B2 | | 5/2005 | Krumrey et al. |
| 2008/0001217 A1 | * | 1/2008 | Kawashima .................. 257/330 |
| 2012/0032218 A1 | * | 2/2012 | Choi ........................ H01L 33/08 257/98 |
| 2013/0328122 A1 | * | 12/2013 | Li et al. ......................... 257/334 |
| 2014/0264569 A1 | * | 9/2014 | Yedinak ............ H01L 21/02104 257/330 |

* cited by examiner

*Primary Examiner* — Marc Armand
*Assistant Examiner* — Sue Tang

(57) ABSTRACT

The present disclosure relates to a semiconductor device. Such a semiconductor device includes a trench metal-oxide-semiconductor (MOS) transistor having two or more electrodes in a trench formed on a substrate of the semiconductor, where a part of a shield electrode positioned at a bottom of the trench is formed to have a large thickness, and a groove is formed in a gate electrode that is stacked on the shield electrode, such that a part of the shield electrode protrudes to a surface of the semiconductor device so as to be connected with a source power.

In such a manner, by minimizing a region in which the shield electrode and the gate electrode overlap, a region that decreases problematic effects, such as leakage current of gate/source or gate/drain of a trench MOS transistor, and a region where high difference of a gate electrode is generated, are removed.

20 Claims, 6 Drawing Sheets

SEMICONDUCTOR DEVICE HAVING A MINIMIZED REGION OF SHEILD ELECTRODE AND GATE ELECTRODE OVERLAP

CROSS-REFERENCE TO RELATED APPLICATIONS

This application claims the benefit under 35 U.S.C. §119 (a) to Korean Patent Application No. 10-2013-0128705 filed on Oct. 28, 2013, the entire disclosure of which is incorporated herein by reference for all purposes.

BACKGROUND

1. Field

The following description relates to a semiconductor device.

2. Description of Related Art

In a double diffused metal-oxide-semiconductor (DMOS) transistor, a channel of a metal-oxide-semiconductor (MOS) transistor mainly used as a semiconductor device for high voltage is usually formed horizontally to a substrate surface. However, recently, according to a reduction of design approach for semiconductor devices, a trench MOS transistor, such as a MOS transistor for high voltage that has a vertical channel that is easily high integrated, has come into the spotlight. Briefly considering the structure of a trench MOS transistor, in a trench MOS transistor a drain is arranged at a back side of a substrate; a source is arranged on a front side of a substrate; a gate is arranged inside a trench which is indented into the substrate surface; and a current flows up and down along a side wall of the trench, in the substrate.

FIG. 1 illustrates a plan view of an active region and an edge region according to a conventional semiconductor device, and FIG. 2 illustrates a sectional view taken on line A-B of FIG. 1.

Referring to FIGS. 1 and 2, a semiconductor is divided into an active region (X) and an edge region (Y). The active region (X) includes a trench 100 and a trench transistor cell 101-1 having contacts 101 inside an active region. The edge region (Y) includes a contact pattern configured to transfer a voltage to an electrode. As shown in FIG. 2, a first insulating film 210 is formed on a substrate 200. A shield structure 220 is formed on the first insulating film 210. A second insulating film 230, a gate structure 240, and a third insulating film 250 are all formed on the upper surface of the substrate. Contact holes 231, 251 are formed in the second insulating film 230 and in the third insulating film 250 respectively.

With respect to the edge region (Y), laminations of the shield structure 220 and the gate structure 240 are unavoidable, because it is necessary to manufacture these structures in successive, stacked layers. However, the wider the stacked extent is, the more easily the gate-to-source current (IGSS) characteristic, such as leakage current of gate/source or gate/drain for the transistor is decreased. Therefore, aspects of semiconductor performance are affected.

Also, due to the above-described stacked structure, absolute generation of high differences in the structure of the semiconductor device is unavoidable. For this reason, there are defects of a defocus in the photo process and defects of a passivation in the etch process.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

The present disclosure is designed to address the aforementioned issues by providing a semiconductor device capable of preventing a decrease of an IGSS characteristic by minimizing an overlap region between a shield electrode and a gate electrode. The present disclosure is also directed to a manufacturing method for the overlap region.

In one general aspect, a semiconductor device includes a substrate that comprises a trench, a first insulating film that is formed at a bottom and a side wall of the trench, a first electrode that is arranged at a bottom region of the trench, a second insulating film that is formed on the first electrode, and in which a groove is formed in order for a part of the first electrode to be exposed, a second electrode that is formed on the second insulating film, and in which a groove is formed in order for a part of the first electrode to be exposed, a first contact portion that is connected with a part of the first electrode, and a second contact portion that is connected with the second electrode.

The part of the first electrode may have a thickness that is greater than other parts of the first electrode.

The part of the first electrode may be formed to follow a groove formed in the second insulating film and the second electrode, and may be formed to be located higher than a surface of the second electrode.

The first contact portion and the second contact portion may be arranged in one direction of the substrate.

The trench included in the substrate may include a main trench in which a trench MOS transistor is formed and a sub-trench for the connection of an electrode in the trench, and the first contact portion may be formed on the sub-trench.

A part of the first electrode positioned at a bottom side of the first contact portion may be formed in the trench of the substrate, so as to sandwich the first insulating film, and the second electrode positioned at a bottom portion of the second contact portion may be formed on the substrate, so as to sandwich the second insulating film.

A part of the first electrode positioned at a bottom side of the first contact portion may not overlap with the second electrode, and the second electrode positioned at a bottom side of the second contact portion may not overlap with the first electrode.

The semiconductor device may further include a Local Oxidation of Silicon (LOCOS) layer between the second electrode positioned at a bottom side of the second contact portion and the substrate.

The first electrode and the second electrode may include polysilicon.

In another general aspect, a semiconductor device includes an active region that comprises trench transistors, and an edge region in which a contact pattern is formed to transfer a voltage to the trench transistors, wherein the edge region includes a substrate that includes a trench, a first insulating film that is formed at a bottom and a side wall of the trench, a first electrode that is arranged at a bottom region of the trench, a second insulating film that is formed on the first electrode, and in which a groove is formed in order for a part of the first electrode to be exposed, a second electrode that is formed on the second insulating film, and in which a groove is formed in order for a part of the first electrode to be exposed, a first contact portion that is connected with a part of the first electrode, and a second contact portion that is connected with the second electrode, wherein the first contact portion is formed over the trench, wherein the second contact portion is formed over a part of the substrate that does not form the trench.

The part of the first electrode may have a thickness that is greater than other parts of the first electrode.

The part of the first electrode may be formed to follow a groove formed in the second insulating film and the second electrode, and may be formed to be higher than a surface of the second electrode.

The first contact portion and the second contact portion may be arranged in one direction of the substrate, wherein the trench formed in the substrate includes a main trench in which a trench MOS transistor is formed and a sub-trench for connection of an electrode in the trench, and wherein the first contact portion is formed on the sub-trench.

A part of the first electrode positioned at a bottom side of the first contact portion may be formed in the trench of the substrate, so as to sandwich the first insulating film, and wherein the second electrode positioned at a bottom portion of the second contact portion may be formed on the substrate, so as to sandwich the second insulating film.

A part of the first electrode positioned at a bottom side of the first contact portion may not overlap with the second electrode, and the second electrode positioned at a bottom side of the second contact portion may not overlap with the first electrode.

The semiconductor device may further include a Local Oxidation of Silicon (LOCOS) layer between the second electrode positioned at a bottom side of the second contact portion and the substrate.

The first electrode and the second electrode may include polysilicon.

In another general aspect, a semiconductor device includes a substrate comprising a trench, wherein the trench comprises a first insulating film that is formed at a bottom and a side wall of the trench, a second insulating film that is formed on a first electrode arranged at a bottom region of the trench, and in which a groove is formed in order for a part of the first electrode to be exposed and having formed upon it a second electrode in which a groove is formed in order for a part of the first electrode to be exposed, a first contact portion that is connected with a part of the first electrode, and a second contact portion that is connected with the second electrode.

The part of the first electrode may have a thickness that is greater than other parts of the first electrode.

Details of the other examples are included in the detailed description of the disclosure and the drawings.

Other features and aspects will be apparent from the following detailed description, the drawings, and the claims.

Figure 1:
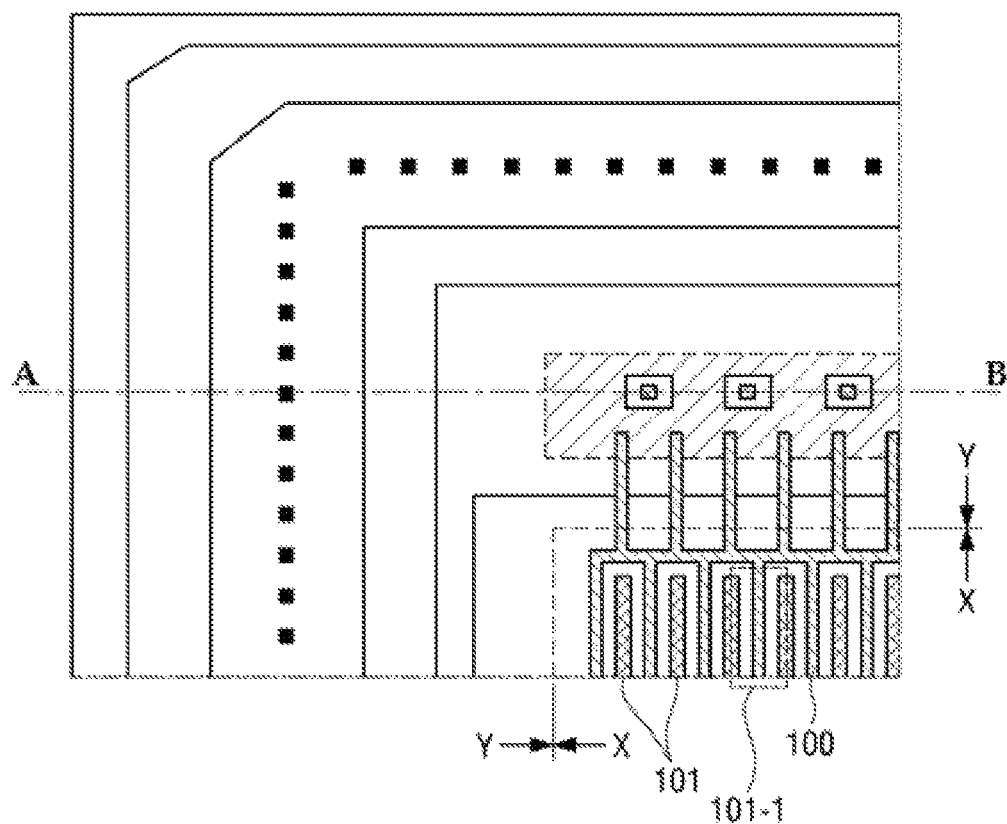
FIG. 1 illustrates a plan view of a semiconductor device.
Figure 2:
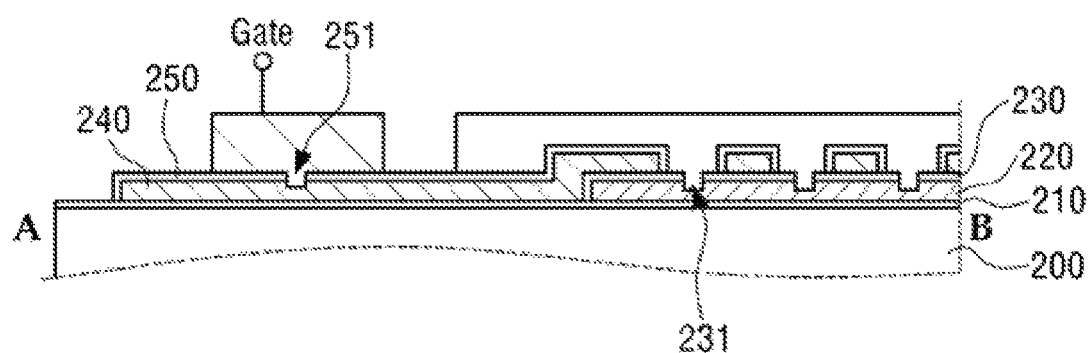
FIG. 2 illustrates a sectional view taken on line A-B in FIG. 1.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Advantages, features and a method of achieving them are now be described more fully with reference to the accompanying drawings in which some examples are shown. The examples may, however, vary or have different forms and should not be construed as limited to the examples set forth herein. Rather, these examples are provided so that this disclosure is thorough and complete and fully conveys the potential scope of the present disclosure to those skilled in the art.

It is to be understood that, although the terms first, second, A, B, etc. are used herein in reference to elements of the disclosure, such elements should not be construed as being limited by these terms. For instance, a first element could be termed a second element, and a second element could be termed a first element, without departing from the scope of the present disclosure. Herein, the term "and/or" includes any and all combinations of one or more of its referents.

The terminology used herein is for the purpose of describing particular examples only and is not intended to be limiting. As used herein, the singular forms "a," "an" and "the" are intended to include the plural forms as well, unless the context clearly indicates otherwise. It is also to be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Hereinafter, examples are described with reference to the accompanying drawings.

The following description further relates to a semiconductor device including a trench MOS transistor with two or more electrodes in a trench formed on a substrate of the semiconductor, where a part of a shield electrode positioned at a bottom of the trench is formed having a large thickness. In such a trench MOS transistor, a groove is formed in a gate electrode that is stacked on the shield electrode, such that a part of the shield electrode protrudes from a surface of the semiconductor device so as to be connected with a source power.

In such a manner, by minimizing the size of a region overlapped between the shield electrode and the gate electrode, a region which decreases IGSS issues, such as a leakage current of a gate/source or a gate/drain of a trench MOS transistor, and a region where high differences of a gate electrode is generated, are removed.

Figure 3:
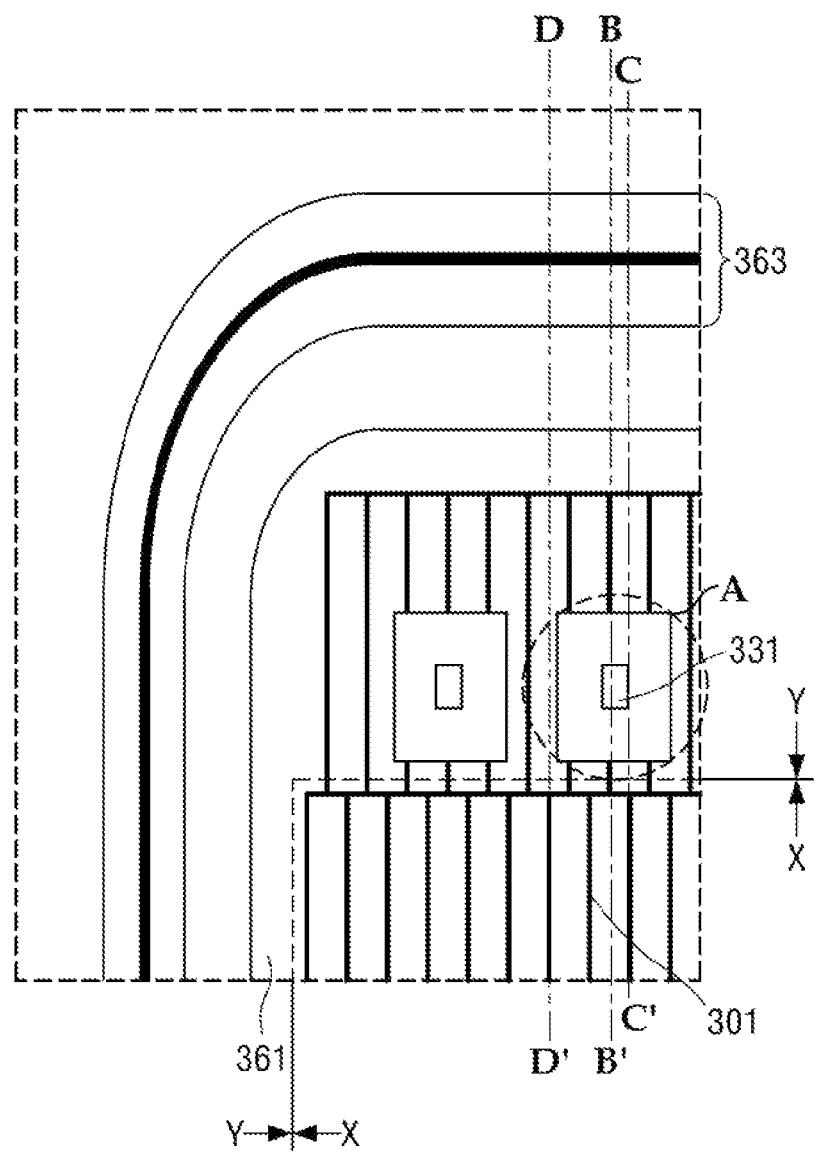
FIG. 3 illustrates a plan view of a part of a semiconductor device according to an example.
Figure 4:
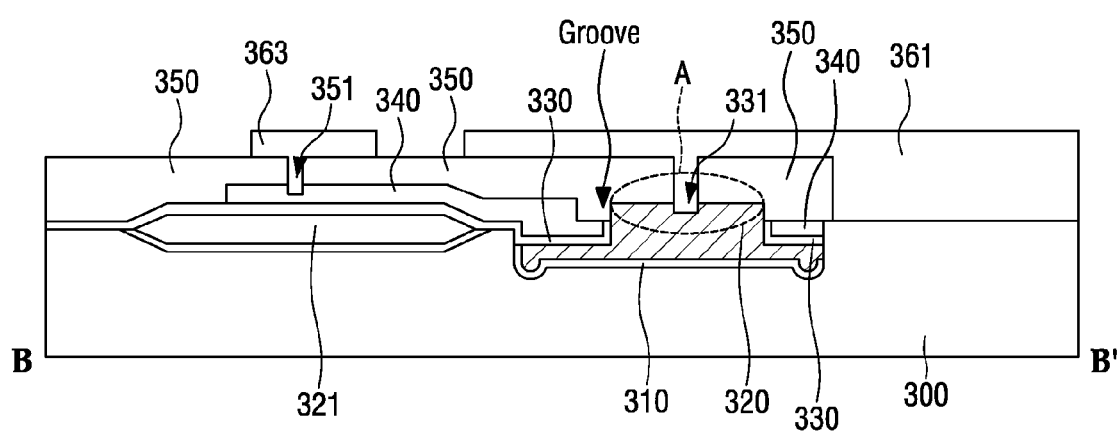
FIG. 4 illustrates a sectional view taken on line B-B' in FIG. 3.
Figure 5:
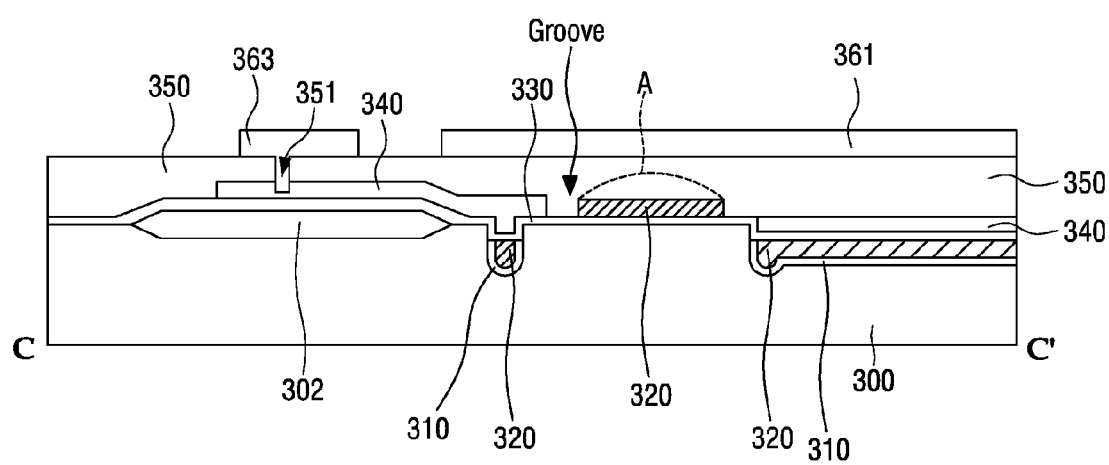
FIG. 5 illustrates a sectional view taken on line C-C' in FIG. 3.
Figure 6:
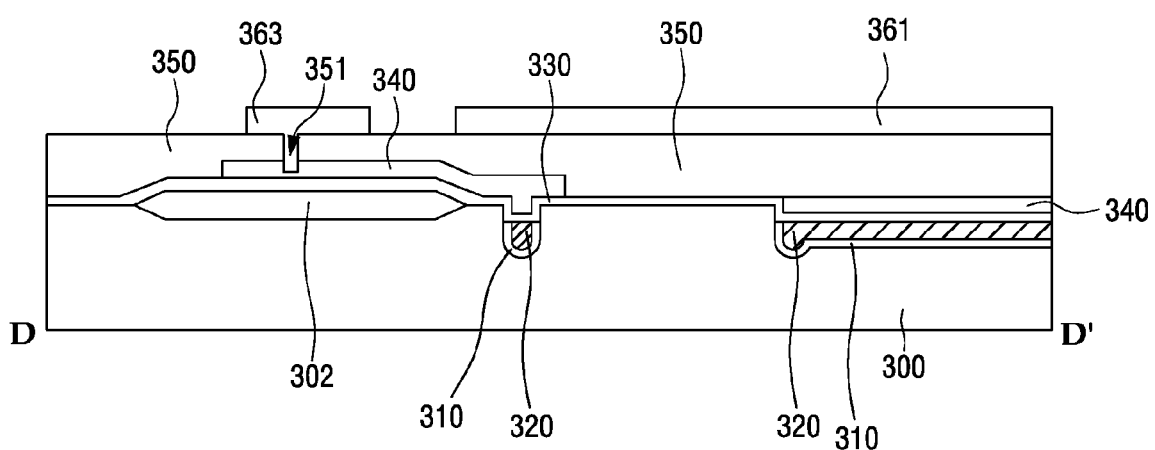
FIG. 6 illustrates a sectional view taken on line D-D' in FIG. 3.

FIG. 3 illustrates a plan view of a part of a semiconductor device according to an example. FIG. 4 illustrates a sectional view taken on line B-B' in FIG. 3. FIG. 5 illustrates a sectional view taken on line C-C' in FIG. 3. FIG. 6 illustrates a sectional view taken on line D-D' in FIG. 3.

As illustrated in FIGS. 3 to 6, according to an example, there is provided a semiconductor device comprising: a substrate 300 which includes a trench 301, a first insulating film 310 that is formed at a bottom and a side wall of the trench 301, a first electrode 320 that is arranged at a bottom region of the trench 301, a second insulating film 330 that is formed on the first electrode 320, and in which a groove is formed in order for a part of the first electrode 320 to be exposed, a second electrode 340 that is formed on the second insulating film 330, and in which a groove is formed in order for a part of the first electrode 320 to be exposed, a first contact portion that is connected with a part of the first electrode 320, and a second contact portion that is connected with the second electrode 340.

A substrate 300 is a wafer of glass substrate, for instance. Such a substrate 300 is preferably made in a way in which one side of the substrate 300, to be more specific, a back surface with respect to the drawing process, is formed to be thicker by certain amount through an additional grinding or a Chemical Mechanical Polishing (CMP) process. The substrate 300 that is thicker is referred to a buffer layer in the embodiments. The substrate 300 is composed of an active region (X) where a semiconductor device is formed in the form of a trench transistor cell, and an edge region (Y) where contact portions, that is, contact patterns, configured to transfer a voltage to a semiconductor device are formed.

According to an example, trench 301 is formed in the active region (X) and the edge region (Y) of the substrate 300, which is classified into a main trench and a sub-trench. That is, this example provides that the trench formed in the active region (X) is a main trench and that the trench formed in the edge region (Y) is a sub-trench.

In particular, a first insulating film 310 is formed on the substrate 300. That is, a first insulating film 310 is formed on the entire surface of the substrate 300. In addition, in an example, the first insulating film 310 is formed at the surface of substrate 300 that includes the bottom surfaces and side walls of the trenches 301 that are formed in the active region (X) and the edge region (Y) of the substrate 300.

The first electrode 320 is formed on the first insulating film 310 in the bottom portion of the trench 301. Also, the first electrode 320 is arranged at bottom portions of the trench 301 formed in the active region (X) and the edge region (Y) of the substrate 300.

The first electrode 320 includes a part (A) that is electrically connected with a first contact portion. The part (A) of the first electrode 320 is formed to have a thickness greater than other parts of the first electrode 320. Preferably, as illustrated in FIGS. 4 and 5, a part (A) of the first electrode 320 is formed to be greater than total thickness of other parts of the first electrode 320 and the second electrode 340 that is stacked on the other parts. In this manner, a part (A) of the first electrode 320 is formed to follow a groove formed in the second insulating film 330 and the second electrode 340, so as to protrude further than the second electrode 340 stacked on the other parts of the first electrode 320. By protruding in this manner, the part (A) of the first electrode 320 is easily connected with the first contact portion.

According to this example, as regards a trench transistor formed in the active region (X) of the semiconductor device, a trench MOS transistor having two electrode structures inside a trench 301 is applied in the example. The first electrode 320 is arranged at a bottom portion of the trench 301, and is referred to a shield electrode or a field electrode. Such a shield electrode plays a role of altering an electric field structure inside a semiconductor device, according to a voltage transferred to the shield electrode.

Subsequently, a second insulating film 330 is formed on the first electrode 320 and the substrate 300. As illustrated in the example of FIGS. 4 and 5, the second insulating film 330 comprises a first contact hole 331 configured to electrically connect a first electrode 320, such as a shield electrode with a first contact pattern 361 by exposing it to the outside, at a sub-trench region in an edge region (Y) viewed at one direction of the semiconductor device. For example, such a direction is direction B-B' or direction C-C'. In particular, a part (A) of the first electrode 320 is formed to protrude further than other parts. Further, a part (A) of the first electrode 320 is exposed at the second insulating film 330, such that a groove capable of being connected with a first contact pattern 361 is formed.

The second insulating film 330 is formed using the same substance as that of the first insulating film 310. According to the example, a first contact hole 331 is referred to as a first contact portion. However, a first contact hole 331 is also used in other examples to refer to an element that further includes a first contact pattern 361 that contacts a first electrode 320, such as a shield electrode, through the first contact hole 331. Thus, such a second insulating film 330 insulates a first electrode 320, such as a shield electrode, and a second electrode 340 that are formed inside trench 301.

A second electrode 340 is formed on the second insulating film 330. That is, a second electrode 340 is formed on a surface of the semiconductor device in which the second insulating film 330 is formed. A groove is formed in the second electrode 340 in order for a part (A) of the first electrode 320 to be exposed.

Referring to FIGS. 3 to 6, a groove having certain size is formed in the second electrode 340 of FIG. 4 in order for a part (A) of the first electrode 320 to be exposed. Since a groove is formed only in one portion of the second insulating film 330 and the second electrode 340, it is to be appreciated that an additional groove is not formed in a second electrode 340 of a sectional view illustrated in FIG. 6. That is, as illustrated in the plan view of FIG. 3, a groove is formed only in one region of the second electrode 340, among all regions.

According to the present disclosure, a semiconductor device enables a region overlapped between a first electrode 320 and a second electrode 340 to be minimized, according to the aforementioned configurations.

A third insulating film 350 is formed on the second electrode 340. The third insulating film 350 includes a second contact hole 351, in order to mutually connect a second contact pattern 363 with a second electrode 340, in the edge region (Y). In an example, the second contact hole 351 is formed simultaneously with a first contact hole 331 on the second insulating film 330 that is exposed to the outside viewed at one direction of the edge region (Y), and is formed using an additional process. In this manner, the present disclosure does not have any limitations for a method of forming a contact hole. Nevertheless, a contact hole in accordance with the examples is potentially formed in an open line form to thus reduce a resistance as the contact extent between each electrode and a contact pattern increases.

Additionally, first and second contact patterns 361, 363 are formed on a third insulating film 350 of the active region (X) as well as a second insulating film 330 and a third insulating film 350 of the edge region (Y), in order to be electrically connected with a bottom electrode through first and second contact holes 351, 353. In an example, a source electrode of the active region (X) is formed simultaneously with formations of the first and second contact patterns 361, 363. An example may offer advantages if the first and second contact patterns 361, 363 and the source electrode are formed using a metal substance having conductivity. Also, in an example, the first and second contact patterns 361, 363 in the edge region (Y) are used as a voltage receiver configured to receive a voltage, and the first contact pattern 361 in such an example is electrically connected with a source power.

In an example, the first contact portion and the second contact portion are arranged in one direction of the substrate 300. That is, as illustrated in FIGS. 4 to 6, the first and second contact portions may be arranged in one direction of the substrate 300.

A part of the first electrode 320 that is positioned at a bottom portion of the first contact portion is formed in the trench 301 of the substrate 300, with the first insulating film 310 sandwiched. Thus, in this example, a part (A) of the first electrode 320 positioned at a bottom side of the first contact portion does not overlap with the second electrode 340.

Further, the second electrode 340 positioned at a bottom side of the second contact portion is formed on the surface of the substrate 300, with the second insulating film 330 sandwiched. Thus, in this example, the second electrode 340 positioned at a bottom side of the second contact portion does not overlap with the first electrode 320.

Further, in another example, a Local Oxidation of Silicon (LOCOS) layer 302 is additionally formed between the second electrode 340 positioned at a bottom side of the second contact portion and the substrate 300. In this example, the LOCOS layer 302 is formed to have a width greater than the second electrode 340 that is stacked on an upper surface of the LOCOS layer 302.

By additionally configuring a LOCOS layer 302 in the examples as described above, capacitance between gate-drain is reduced and by so doing, an overall AC characteristic of the device is improved. As a result, the semiconductor device performs better.

In an example, the first electrode 320 and the second electrode 340 are composed of polysilicon. Polysilicon, also referred to as polycrystalline silicon, is a silicon material including small crystals known as crystallites. Polysilicon is used as the conducting gate material in metal-oxide-semiconductor field-effect transistor (MOSFET) and complementary metal-oxide-semiconductor (CMOS) processing technologies. Also, in other examples, the first electrode 320 and the second electrode 340 are composed of materials such as titanium dioxide ($TiO_2$) or cadmium sulfide (CdS). Respective appropriate electrode structures of the present examples are available to those skilled in the art and are considered to be within the scope of the present examples.

According to the present examples, there is provided a semiconductor device in which doping layers such as an N++ layer having high concentration, an N-layer having low concentration, a P type layer, a P+ type layer having high concentration, where the layers are positioned at a bottom of the substrate 300, are formed through the performance of an additional process, in order to form a semiconductor device on the substrate 300. After forming an additional epitaxial layer on a substrate 300, these doping layers of examples may be, for example, an N++ layer having high concentration, an N-layer having low concentration, and a P type layer that are formed on the epitaxial layer. A trench 301 in accordance with the examples is formed after such the doping process, and is formed of an N++ layer having high concentration and a P+ layer having high concentration for formation of a drift region before forming a third insulating film. With respect to these features, the examples have no limitations for a method of forming such a doping layer of a device, and appropriate approaches may be used to perform the doping. In one example, the doping layers are formed by selectively doping and spreading of a dopant.

Furthermore, a semiconductor device in accordance with the examples potentially also includes a drain electrode that is formed at a bottom surface of the substrate 300. In an example, such a drain electrode has a certain thickness after passing through a chemical-mechanical planarization (CMP) process against a bottom surface of a wafer. Chemical-mechanical polarization is a process involves pressing wafers into rotating pads in the presence of certain slurry blends that facilitate removal by chemically aided nano-scale abrasion. For example, the drain electrode is formed using the same substance as that of other electrodes. The drain electrode potentially further includes an implant layer that is used in a P type collector, as a way to implement a P type implant between a substrate 300 and the drain electrode and thus implement a baking process for constructing the semiconductor device.

Through the configurations set forth above, according to the examples, there is provided a way of constructing a semiconductor device so that it is capable of preventing a decrease of IGSS characteristic of the semiconductor device, which would otherwise cause the occurrence of certain issues as discussed above. The configurations accomplish this feature by minimizing a region where a first electrode 320 and a second electrode 340 in trench 301 overlap.

Further, by minimizing a region where a first electrode 320 and a second electrode 340 overlap, an absolute difference between the regions due to the overlap is lowered, such that the ability to perform a subsequent process, such as a photo process, is facilitated.

Further, by reducing an absolute difference between the regions, an overall thickness of photoresist can be lowered and by so doing, a degree of agglomeration of a semiconductor device can be elevated by comparison with alternative semiconductor devices.

Unless indicated otherwise, a statement that a first layer is "on" a second layer or a substrate is to be interpreted as covering both a case where the first layer is directly contacts the second layer or the substrate, and a case where one or more other layers are disposed between the first layer and the second layer or the substrate.

The spatially-relative expressions such as "below", "beneath", "lower", "above", "upper", and the like may be used to conveniently describe relationships of one device or elements with other devices or among elements. The spatially-relative expressions should be understood as encompassing the direction illustrated in the drawings, added with other directions of the device in use or operation. Further, the device may be oriented to other directions and accordingly, the interpretation of the spatially-relative expressions is based on the orientation.

The expression such as "first conductivity type" and "second conductivity type" as used herein may refer to the conductivity types such as N or P types which are opposed to each other, and an example explained and exemplified herein encompasses complementary examples thereof.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device comprising:
   a substrate that comprises a trench;
   a first insulating film that is formed at a bottom and a side wall of the trench;
   a first electrode that is arranged at a bottom region of the trench;
   a second insulating film, formed on the first electrode, comprising a groove, wherein a part of the first electrode is exposed by the groove, and the second insulating film does not extend to at least a portion of the side of the part of the first electrode that is exposed by the groove;
   a second electrode, formed on the second insulating film, also comprising the groove;
   a first contact portion that is connected with the part of the first electrode; and
   a second contact portion that is connected with the second electrode.

2. The semiconductor device of claim 1, wherein the part of the first electrode has a thickness that is greater than other parts of the first electrode.

3. The semiconductor device of claim 1, wherein the first contact portion and the second contact portion are arranged in one direction of the substrate.

4. The semiconductor device of claim 1, wherein the trench included in the substrate comprises a main trench in which a trench MOS transistor is formed and a sub-trench for the connection of an electrode in the trench, and wherein the first contact portion is formed on the sub-trench.

5. The semiconductor device of claim 1, wherein a part of the first electrode positioned at a bottom side of the first contact portion is formed in the trench of the substrate, so as to sandwich the first insulating film, and wherein the second electrode positioned at a bottom portion of the second contact portion is formed on the substrate, so as to sandwich the second insulating film.

6. The semiconductor device of claim 1, wherein a part of the first electrode positioned at a bottom side of the first contact portion does not overlap with the second electrode, and wherein the second electrode positioned at a bottom side of the second contact portion does not overlap with the first electrode.

7. The semiconductor device of claim 1, further comprising:
   a Local Oxidation of Silicon (LOCOS) layer between the second electrode positioned at a bottom side of the second contact portion and the substrate.

8. The semiconductor device of claim 1, wherein the first electrode and the second electrode comprise polysilicon.

9. The semiconductor device of claim 1, wherein the second electrode also does not extend to the at least a portion of the side of part of the first electrode that is exposed by the groove.

10. The semiconductor device of claim 1, wherein the part of the first electrode is formed to protrude higher than a top surface of a part of the second electrode stacked on other parts of the first electrode.

11. A semiconductor device comprising:
    an active region that comprises trench transistors; and
    an edge region in which a contact pattern transfers a voltage to the trench transistors,
    wherein the edge region comprises
    a substrate that comprises
    a trench,
    a first insulating film that is formed at a bottom and a side wall of the trench,
    a first electrode that is arranged at a bottom region of the trench,
    a second insulating film, formed on the first electrode, comprising a groove, wherein a part of the first electrode is exposed by the groove, and the second insulating film does not extend to at least a portion of the side of the part of the first electrode that is exposed by the groove,
    a second electrode, formed on the second insulating film, also comprising the groove,
    a first contact portion that is connected with the part of the first electrode, and
    a second contact portion that is connected with the second electrode,
    wherein the first contact portion is formed over the trench,
    wherein the second contact portion is formed over a part of the substrate that does not form the trench.

12. The semiconductor device of claim 11, wherein the part of the first electrode has a thickness that is greater than other parts of the first electrode.

13. The semiconductor device of claim 11, wherein the first contact portion and the second contact portion are arranged in one direction of the substrate.

14. The semiconductor device of claim 11, wherein the trench formed in the substrate comprises a main trench in which a trench MOS transistor is formed and a sub-trench for connection of an electrode in the trench, and wherein the first contact portion is formed on the sub-trench.

15. The semiconductor device of claim 11, wherein a part of the first electrode positioned at a bottom side of the first contact portion is formed in the trench of the substrate, so as to sandwich the first insulating film, and wherein the second electrode positioned at a bottom portion of the second contact portion is formed on the substrate, so as to sandwich the second insulating film.

16. The semiconductor device of claim 11, wherein a part of the first electrode positioned at a bottom side of the first contact portion does not overlap with the second electrode, and wherein the second electrode positioned at a bottom side of the second contact portion does not overlap with the first electrode.

17. The semiconductor device of claim 11, further comprising:
    A Local Oxidation of Silicon (LOCOS) layer between the second electrode positioned at a bottom side of the second contact portion and the substrate.

18. The semiconductor device of claim 11,
    wherein the first electrode and the second electrode comprise polysilicon.

19. A semiconductor device comprising:
    a substrate comprising a trench, wherein the trench comprises
    a first insulating film that is formed at a bottom and a side wall of the trench;
    a second insulating film that is formed on a first electrode arranged at a bottom region of the trench, comprising a groove, wherein a part of the first electrode is exposed by the groove, and the second insulating film does not extend to the part of the first electrode that is exposed by the groove, and a second electrode also comprises the groove, wherein the second insulating film does not extend to at least a portion of the side of the part of the first electrode that is exposed by the groove;
    a first contact portion that is connected with the part of the first electrode; and
    a second contact portion that is connected with the second electrode.

20. The semiconductor device of claim 19,
    wherein the part of the first electrode has a thickness that is greater than other parts of the first electrode.

* * * * *